US010727667B2

(12) United States Patent
Austad et al.

(10) Patent No.: US 10,727,667 B2
(45) Date of Patent: Jul. 28, 2020

(54) INTEGRATED CIRCUITS

(71) Applicant: NORDIC SEMICONDUCTOR ASA, Trondheim (NO)

(72) Inventors: Tore Austad, Trondheim (NO); Carsten Wulff, Trondheim (NO); Ruben Undheim, Trondheim (NO)

(73) Assignee: NORDIC SEMICONDUCTOR ASA, Trondheim (NO)

( * ) Notice: Subject to any disclaimer, the term of this patent is extended or adjusted under 35 U.S.C. 154(b) by 410 days.

(21) Appl. No.: 15/537,631

(22) PCT Filed: Dec. 14, 2015

(86) PCT No.: PCT/GB2015/053978
§ 371 (c)(1),
(2) Date: Jun. 19, 2017

(87) PCT Pub. No.: WO2016/097710
PCT Pub. Date: Jun. 23, 2016

(65) Prior Publication Data
US 2017/0353029 A1    Dec. 7, 2017

(30) Foreign Application Priority Data
Dec. 19, 2014    (GB) .................................. 1422818.3

(51) Int. Cl.
*H02H 9/04*    (2006.01)
*H04B 5/00*    (2006.01)
(Continued)

(52) U.S. Cl.
CPC ......... *H02H 9/046* (2013.01); *G06K 19/0705* (2013.01); *G06K 19/0715* (2013.01);
(Continued)

(58) Field of Classification Search
CPC ........ H02H 9/046; H03K 5/08; H04B 5/0025; H04B 5/0031; G06K 19/0705; G06K 19/0715; G06K 19/0725
(Continued)

(56) References Cited

U.S. PATENT DOCUMENTS

2006/0232318 A1    10/2006  Iwahori et al.
2008/0106837 A1    5/2008   Jang
(Continued)

FOREIGN PATENT DOCUMENTS

EP    2675077 A2    12/2013

OTHER PUBLICATIONS

International Search Report and Written Opinion for PCT/GB2015/053978; dated Feb. 18, 2016 (11 pages).
(Continued)

*Primary Examiner* — Danny Nguyen
(74) *Attorney, Agent, or Firm* — Womble Bond Dickinson (US) LLP; John J. Penny, Jr.

(57) ABSTRACT

A semiconductor integrated circuit device comprises at least first and second circuits said first and second circuits being connected to a shared external connection. The device further comprises a voltage clamp that is operable to limit a voltage at the shared external connection. The voltage clamp can be selectively enabled depending upon whether the first or second circuit is being used.

17 Claims, 6 Drawing Sheets

(51) Int. Cl.
　　　*G06K 19/07* (2006.01)
　　　*H03K 5/08* (2006.01)
(52) U.S. Cl.
　　　CPC .......... *G06K 19/0725* (2013.01); *H03K 5/08* (2013.01); *H04B 5/0025* (2013.01); *H04B 5/0031* (2013.01)
(58) Field of Classification Search
　　　USPC .......................................... 361/91.1, 56, 111
　　　See application file for complete search history.

(56) References Cited

U.S. PATENT DOCUMENTS

| | | | |
|---|---|---|---|
| 2008/0246667 A1* | 10/2008 | Symons | G06K 19/0723 343/702 |
| 2010/0002345 A1 | 1/2010 | Young et al. | |
| 2011/0215756 A1 | 9/2011 | Shimizu | |
| 2012/0281322 A1* | 11/2012 | Pugsley | H01L 27/0285 361/56 |
| 2013/0337744 A1* | 12/2013 | Lefley | H04B 5/00 455/41.1 |

OTHER PUBLICATIONS

Search Report dated Jul. 14, 2015, for UK Application No. GB1422818.3 (3 pages).

* cited by examiner

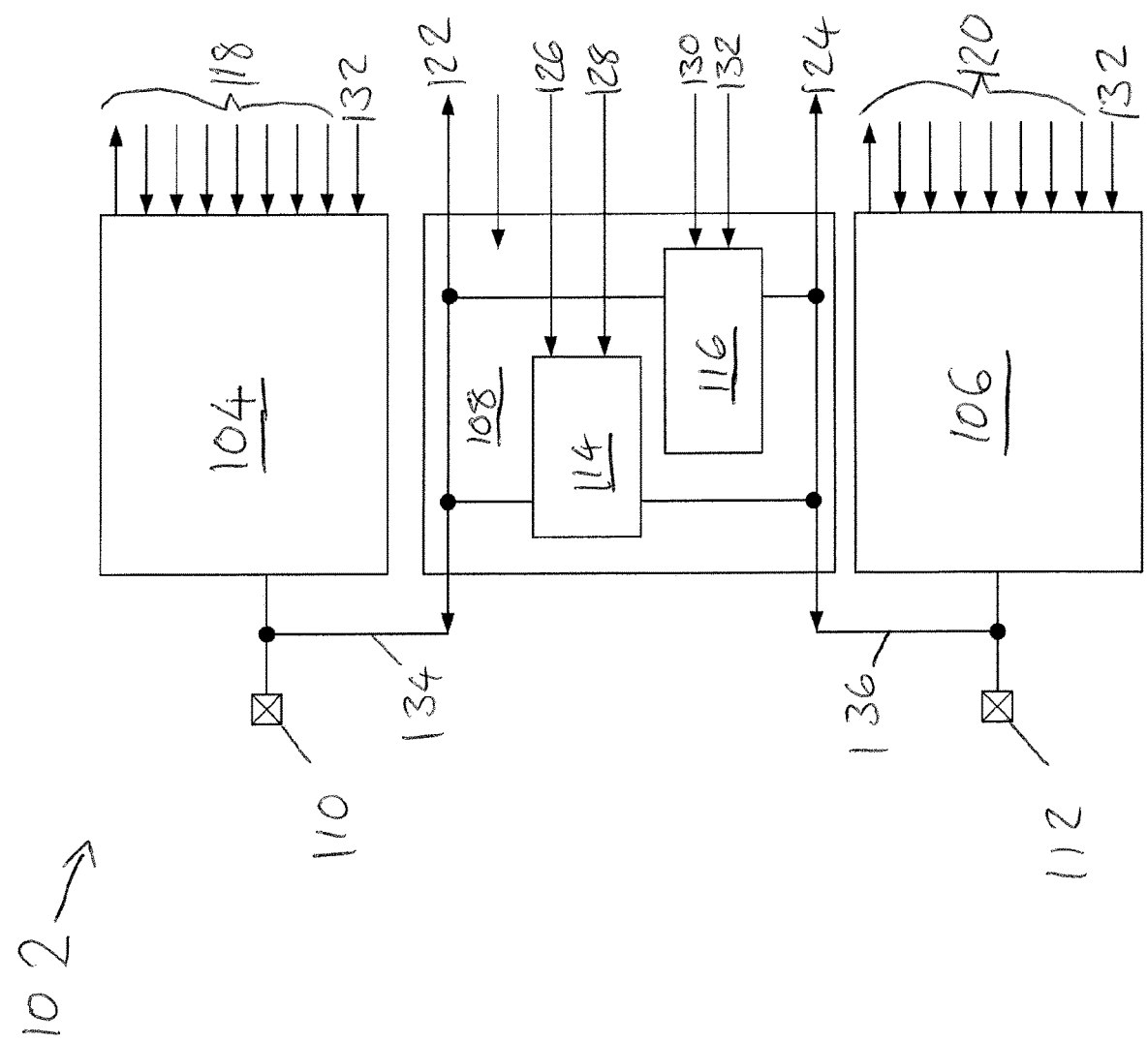

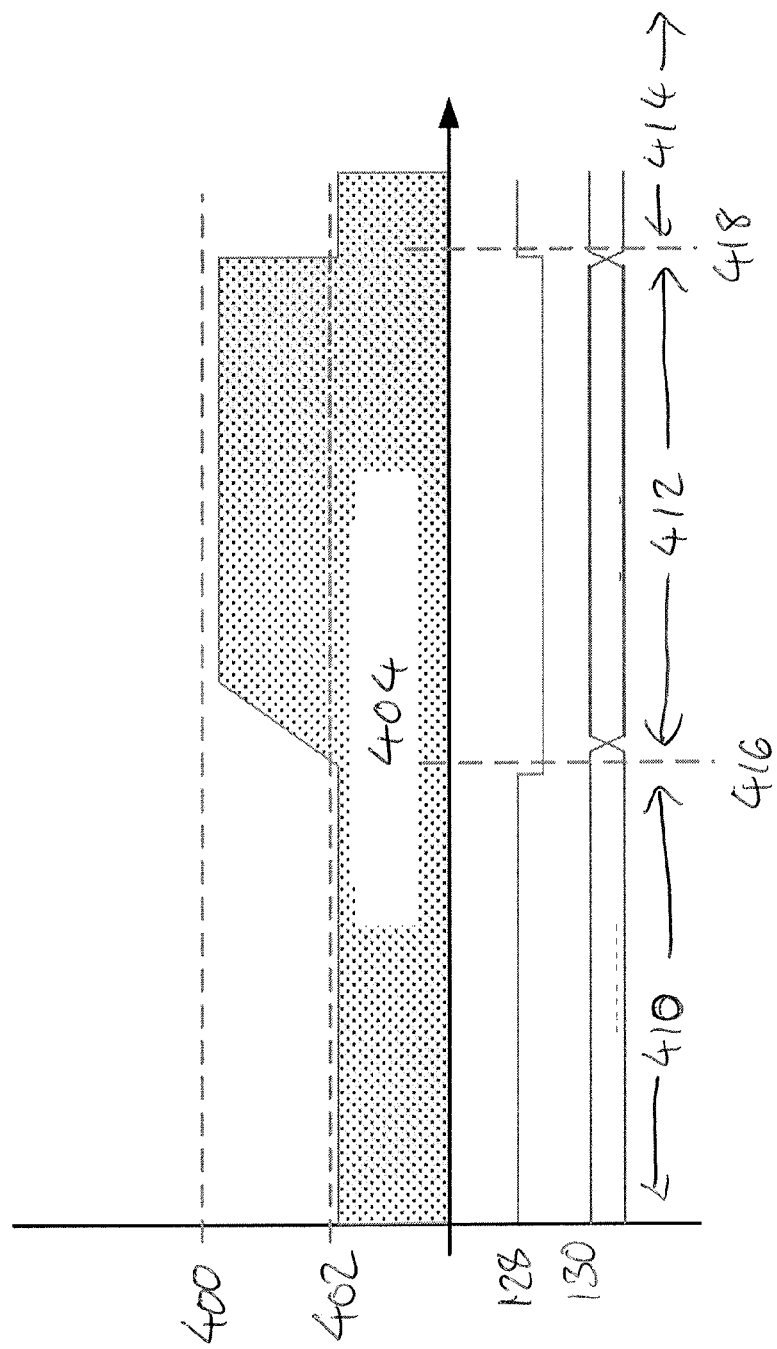

INTEGRATED CIRCUITS

This application claims priority under 35 U.S.C. § 119 to Great Britain Patent Application No. 1422818.3 filed on Dec. 19, 2014, and under 35 U.S.C. § 365 to PCT/GB2015/053978 filed on Dec. 14, 2015. The entire disclosures of which are expressly incorporated by reference herein.

This invention relates to semiconductor integrated circuit devices, particularly multi-functional devices such as system-on-chip (SoC) devices.

Modern semiconductor integrated circuits often implement an SoC arrangement, wherein a single integrated circuit may comprise the components typical of a computing system, i.e. a processor, memory, clock and external interfaces (e.g. USB, Ethernet, etc.), and wireless communication hardware. Such wireless communication hardware may be used for wireless communication protocols including wireless local area network (WLAN), Bluetooth™, and near field communications (NFC). In the case of NFC, a small loop antenna is connected to the integrated circuit and provides the SoC with the capability to communicate over short ranges using a local electric or magnetic field. NFC connectivity has become increasingly popular in recent times in mobile devices for short range communication and there is therefore demand for including this functionality in a system-on-chip implemented in an integrated semiconductor device. However the Applicant has recognised that it may not be required by all customers.

From a first aspect, the invention provides a semiconductor integrated circuit device comprising at least first and second circuits, said first and second circuits being connected to a shared external connection, said device further comprising a voltage clamp that is operable to limit a voltage at the shared external connection, wherein said voltage clamp can be selectively enabled depending upon whether said first or second circuit is being used.

Thus it will be seen by those skilled in the art that, in accordance with the invention, a device is arranged such that the shared external connection, typically a pin, can be utilised for a plurality of functions, with voltage protection that may be appropriate for one function that can be enabled if required, but disabled for the other function which does not require it.

A system-on-chip implemented in such an integrated semiconductor device typically comprises a number of pins that can be configured for a range of uses, including for general purpose input and output (GPIO) and for the connection of external peripherals to the integrated circuit. However, it is often the case that when these devices are fabricated, the purpose to which customers will put them is not known. Previously this meant that the manufacturer of a conventional system-on-chip device would either have to provide a wider product range to cater to a diverse range of end-user requirements, or provide a product with redundant connections corresponding to functions not used by all customers. In accordance with the invention however, customers not wishing to use the function provided by the first circuit may use the second circuit and vice versa. This optimises further the resources available from the device for all customers and so allows those not using a provided function to enjoy a compensatory benefit by making the shared external connection available for another use.

In a set of embodiments the first circuit at least partly implements a near-field communication protocol and is configured to be connected to an external antenna via said shared external connection. Indeed the invention extends to an assembly comprising a device as hereinbefore described and an antenna connected to said shared external connection. In some embodiments for example, the integrated semiconductor device forms part of an emulated NFC tag.

In a set of embodiments the second circuit comprises a general input/output interface such that the shared external connection can be used as a general input output connection. Such connections can have their function assigned by a user and can be used for both input and output. This is likely to maximise the flexibility of the device such that as many customers as possible can make use of all the connections available.

In providing, in accordance with the invention, multiple circuits within an integrated semiconductor device that share at least one external connection, the Applicant has appreciated that those circuits may have different voltage range requirements for their operation. The Applicant has appreciated that providing a voltage clamp may allow whichever circuit is enabled to be operated safely by ensuring that components are not damaged by exposure to higher voltages, without having to increase power consumption or reduce performance.

In a set of embodiments the device comprises two shared external connections. This would, for example, enable connection to an NFC antenna as set out above. In a set of such embodiments the voltage clamp is arranged to limit a maximum voltage that can be applied across said shared external connections. This would, for example, prevent excessive voltages which may develop across an attached NFC antenna from damaging the device whereas this may not be necessary when no antenna is connected. In a set of embodiments therefore the voltage clamp is enabled when an NFC circuit is enabled so as to allow an NFC antenna to be safely attached and the voltage clamp is disabled when an NFC circuit is disabled—e.g. when a general purpose input/output circuit is enabled.

A single voltage clamp may be provided but in a set of embodiments at least two voltage clamps are provided with different clamp voltage values. Having two different voltage clamps is particularly beneficial where the circuit they protect can have an active and an inactive mode. During the inactive mode both of, or the lower of, the voltage clamps may be enabled, whereas in the active state only the higher voltage clamp is enabled. Preferably an alternative voltage control mechanism is employed in said active state. This means that good, simple protection is provided from the lower clamp value when the voltage across the shared external connections does not matter. When the circuit is active ultimate excess voltage protection is still provided but other, less limiting protection can be employed below this value.

In an exemplary set of embodiments where, as is preferred, the circuit protected by the voltage clamps is an NFC circuit having active and inactive modes, in the inactive mode the lower voltage clamp is enabled but in the active mode the lower voltage clamp is disabled. In an exemplary set of embodiments the lower voltage clamp value is set at the lower end of a design supply voltage range. Where reference is made herein to a voltage clamp value being at the lower end of a design voltage range' it should be understood that this is not intended to limit the clamp value exactly to the lowest voltage in the design supply voltage range, but that the clamp value may be within a certain tolerance thereof. The voltage clamp value could, for example be within 20% of the lowest voltage in the design supply voltage range or within 10% of the lowest voltage in the design supply voltage range.

Setting the clamp value at or close to the lowest intended supply voltage makes it possible to ensure that the actual supply voltage is not, or not significantly, exceeded in a simple, low power way compared to varying the clamp voltage according to an actual supply voltage which cannot necessarily be predicted (other than being assumed to be in the design supply voltage range).

In a set of embodiments a regulation loop is provided to control the voltage across the shared external connections (and thus across the NFC antenna in the preferred embodiments) when the NFC circuit is in its active state. This allows the NFC circuit to use the full supply voltage which is actually available. This is important for optimal performance. The higher voltage clamp may simply provide backup protection against an absolute maximum voltage across the shared external connection. Such an arrangement provides the advantageous combination of low power consumption while the NFC circuit is in its inactive mode (which would usually be most of the time) and high performance when it is active.

It should be understood that where reference is made to two voltage clamps these could be separate and independent or could be provided by a single mechanism which can have two values. It should also be understood that references to two clamps or voltages should not be interpreted as restrictive and therefore that further clamps or voltages could be provided.

In some embodiments the regulation loop comprises a variable resistance. In a set of embodiments the regulation loop comprises a variable shunt resistance connected across the shared external connections.

In a set of embodiments the integrated semiconductor device comprises a field detection circuit. In short range communication applications such as NFC, the Applicant has appreciated that it is advantageous to detect whether an appropriate electric or magnetic field is present before enabling the associated communication circuit within the system-on-chip. The field detection circuit may therefore be used to switch between the aforementioned active and inactive NFC modes.

In modern mobile devices, it is advantageous to keep power requirements to a minimum. The Applicant has appreciated that the invention disclosed herein is particularly suited to such applications. In a set of embodiments the integrated semiconductor device is implemented in a battery powered integrated circuit.

An embodiment of the present invention will now be described, by way of example only, with reference to the accompanying drawings, in which:

FIG. 10 is an effective circuit diagram of the embodiment of FIG. 1A when operated in a second mode;

FIG. 4 is a timing diagram associated with the exemplary embodiment of FIG. 1A.

Figure 1B:
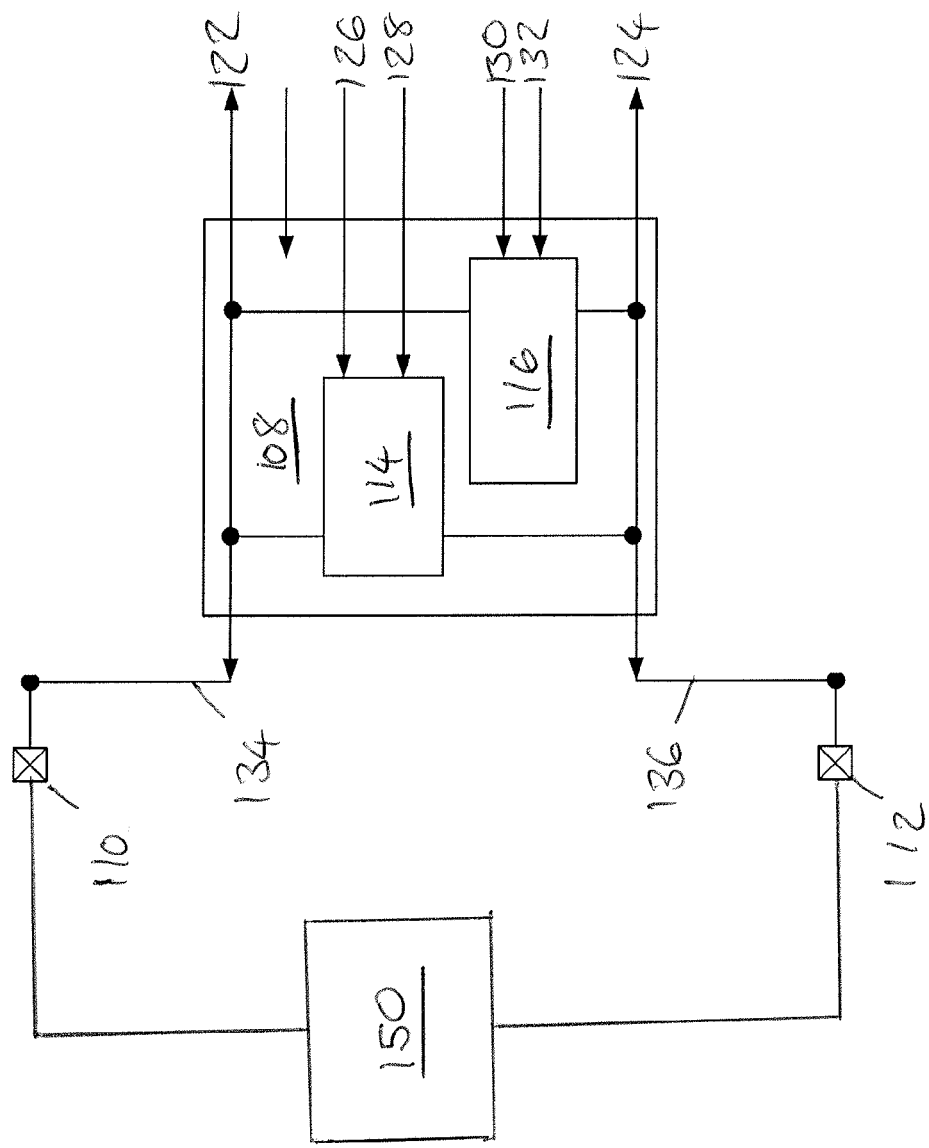
FIG. 1B is an effective circuit diagram of the embodiment of FIG. 1A when operated in a first mode.

FIG. 1A shows a circuit diagram of an exemplary embodiment of the present invention as a subsystem 102 of a system-on-chip (SoC) provided by a semiconductor integrated circuit device. The described subsystem comprises two identical general input/output (GPIO) circuits 104, 106 and an NFC interface circuit 108. These three circuits have shared access to two external connections in the form of pins 110, 112. More specifically, a first GPIO circuit 104 is connected to a first pin 110, a second GPIO circuit 106 is connected to a second pin 112, and the NFC interface circuit 108 is connected to both pins 110, 112.

The GPIO circuits 104, 106 comprise a series of inputs and outputs 118, 120. These inputs and outputs 118, 120 are used for a variety of functions relating to the operation of the GPIO circuits 104, 106 such as sending and receiving data, enabling pull up or pull down resistors, etc.

The NFC interface circuit 108 comprises a dual voltage clamp 114 and a variable resistance 116 that acts as part of a regulation loop which controls voltage across the pins when the NFC circuit is in its active mode. The voltage clamp 114 takes as inputs two enable signals 126, 128. A first 'enable clamp high' signal 126 enables the higher voltage clamp 114 which is set to permit a high supply voltage range, while a second 'enable clamp low' signal 128 enables the lower voltage clamp which is set at the lower limit of the design supply voltage range. In one particular non-limiting example the higher voltage clamp is set at 3.6V whereas the lower voltage clamp is set at 2.2V corresponding to the specified design voltage supply range of the device of 2.2V to 3.6V. The higher voltage clamp ensures that voltages across the pins 110, 112 never exceed values that would damage the device, whereas the lower voltage clamp, in a simple and power-efficient way, ensures that voltages across the pins 110, 112 never exceed the supply voltage when the NFC circuit is inactive for the complete device supply voltage range, even when the supply voltage is at its lower limit in the range.

As will be described in more detail below, the variable resistance 116 is used effectively to connect or disconnect the NFC circuit and also forms part of a regulation loop which controls voltage across the pins 110, 112 while the NFC circuit is active. It takes as its input a resistance control signal. In this example, the resistance control signal 130 comprises an n-bit word that can range in value from 0 to $2^n-1$, which dictates the value of the variable resistance 116, wherein 0 indicates a high impedance (virtual open circuit) mode and 1 indicates a relatively high resistance, while $2^n-1$ indicates low resistance.

The NFC interface circuit 108 further comprises two NFC inputs for receiving data via NFC using an antenna connected across the two pins 110, 112 and sending said received data 122, 124 to a demodulation module, and two NFC outputs for sending data 134, 136 via NFC using the antenna.

FIG. 1B shows an effective circuit diagram of the embodiment of FIG. 1A in a first mode of use. The pins 110, 112 have been connected to an NFC antenna 150 and the circuit is being operated in an NFC mode. As such, the GPIO circuits 104, 106 have effectively been disconnected, leaving the pins 110, 112 connected only to the NFC interface circuit 108.

Figure 1C:
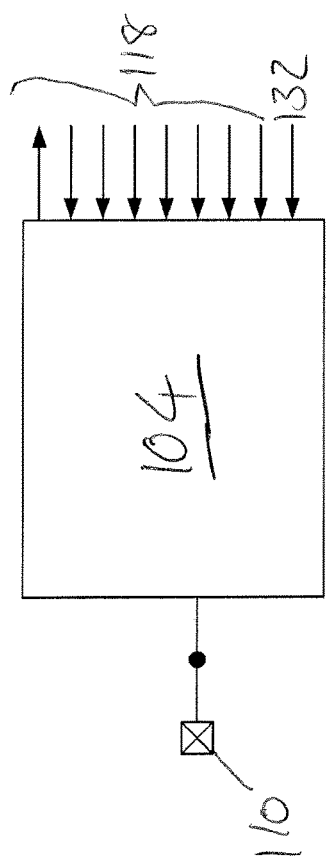
FIG. 1A is a circuit diagram of a first exemplary embodiment of the present invention.
Figure 1C:
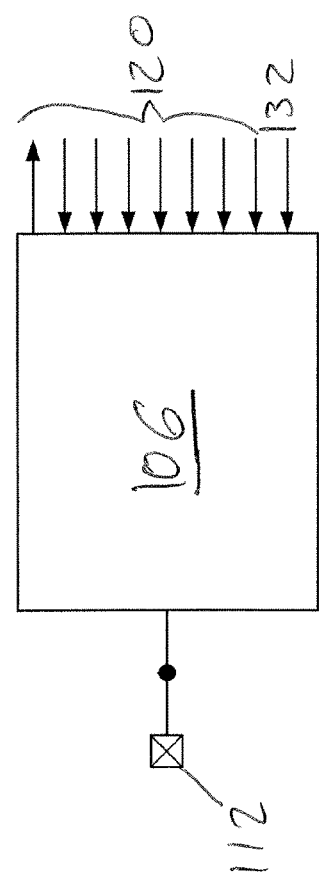

FIG. 1C shows an effective circuit diagram of the embodiment of FIG. 1A in a second mode of use. The circuit is here being operated without connection to an NFC antenna and the NFC interface circuit 108 has effectively been disconnected, leaving the pins 110, 112 connected only to the GPIO circuits 104, 106. In this mode the voltage clamp 114 is disabled.

Figure 2:
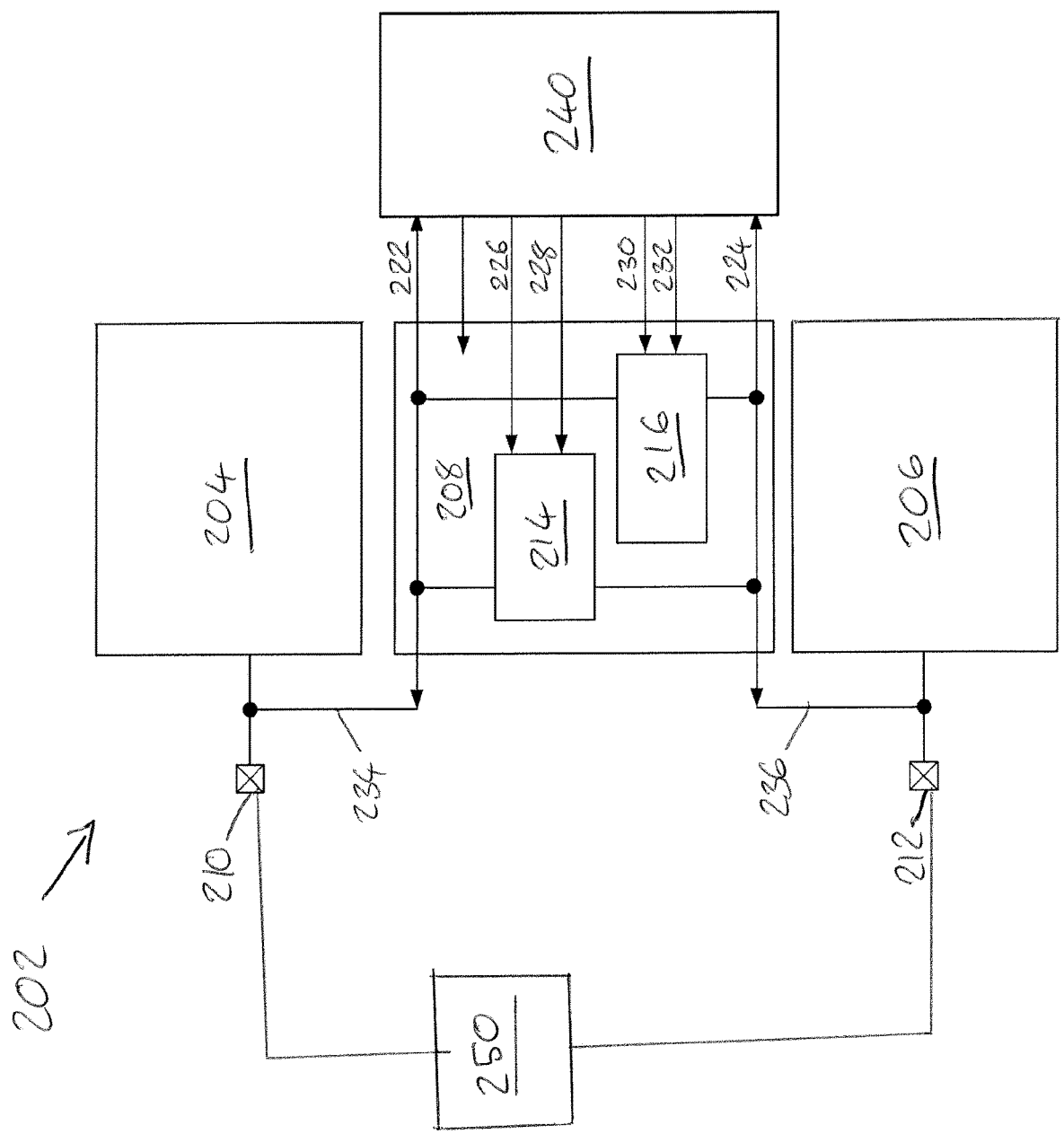
FIG. 2 is a circuit diagram of a second exemplary embodiment of the present invention.

FIG. 2 shows a circuit diagram of a second exemplary embodiment of the present invention as a subsystem 202 of a system-on-chip (SoC) provided by a semiconductor integrated circuit device. This embodiment is similar to the embodiments of FIGS. 1A to 10, except that the NFC interface circuit 208 is connected to an NFC transmission and reception module 240. This NFC transmission and reception module 240 contains a number of amplifiers, filters etc. as required to transmit and receive NFC traffic via an NFC antenna 250 connected to the pins 210, 212 as would be expected by a person skilled in the art.

Figure 3:
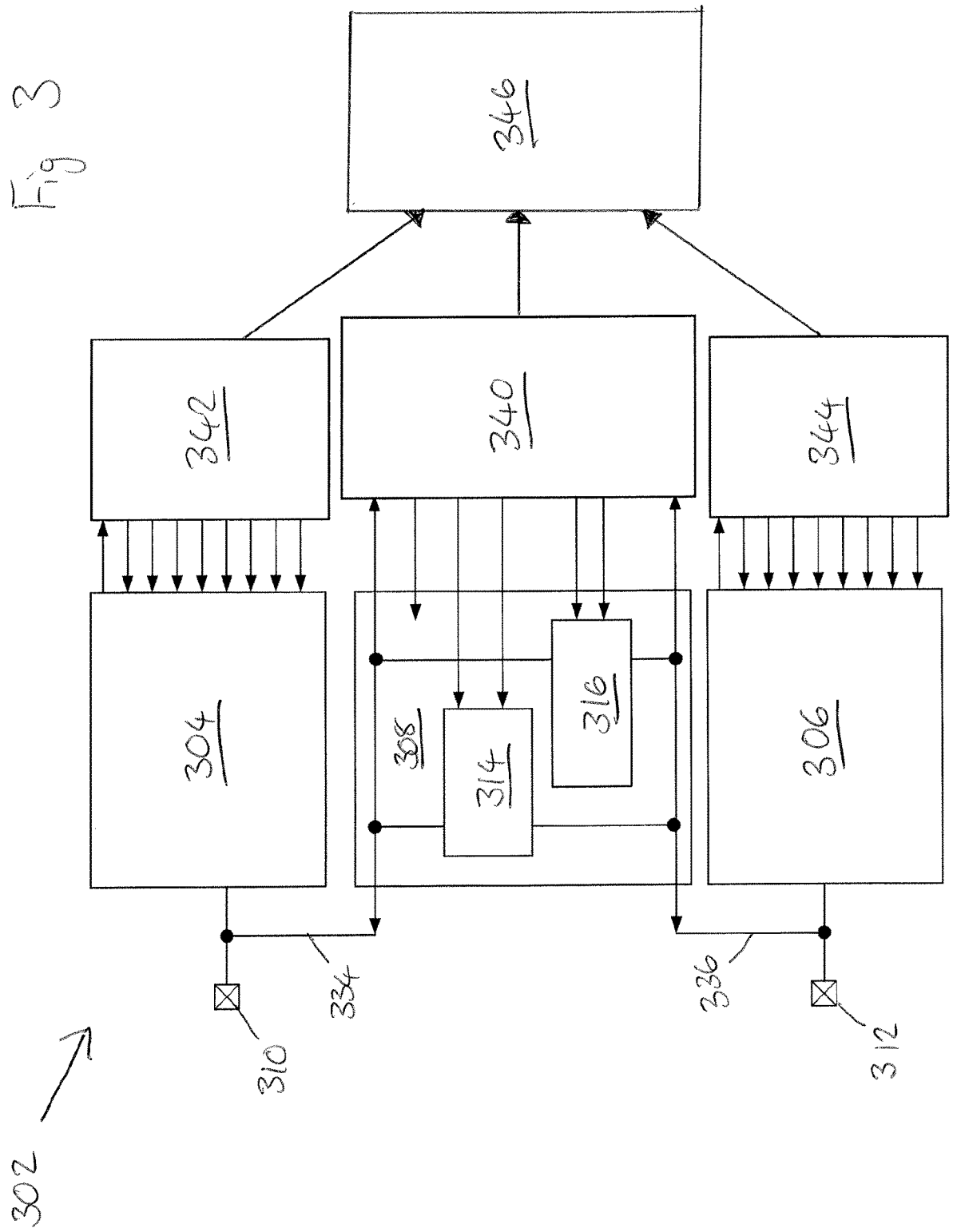
FIG. 3 is a circuit diagram of a third exemplary embodiment of the present invention.

FIG. 3 shows a circuit diagram of a further exemplary embodiment of the present invention as a subsystem 302 of a system-on-chip (SoC) provided by a semiconductor integrated circuit device. This embodiment is similar to the embodiments of FIGS. 1A to 10, except that the GPIO modules 304, 306 are each connected to a GPIO interface module 342, 344 and the NFC interface circuit 308 is connected to an NFC interface module 340. These interface modules 340, 342, 344 are each connected to a processor 346 that carries out the various operations required when the SoC 302 is being used either in a GPIO or NFC application.

FIG. 4 shows a timing diagram associated with the exemplary embodiment of FIG. 1A which illustrates operation of the embodiments described above. FIG. 4 depicts a steady, real supply voltage 400. There is also a low voltage clamp threshold 402, which is set to the lowest allowed voltage in the design supply voltage range.

The amplitude 404 of the voltage on the pins 110, 112 at any given moment in time is subject to change, depending on the current mode of operation of the system-on-chip 102, dictated by the state of the enable clamp low signal 128 and the resistance control signal 130.

For an initial duration 410, the system-on-chip 102 is in an NFC inactive mode. During this time, the low power, passive lower voltage clamp is enabled by setting the enable clamp low signal 128 to logic high. Accordingly, the variable resistance 116 is set to a high impedance mode by setting the resistance control signal 130 to 0. The amplitude 404 of the voltage is then clamped just below the low voltage clamp threshold.

At the end of duration 410 at time 416, the system-on-chip 102 is switched into an NFC active mode for a duration 412. At this time 416, the enable clamp low signal 128 is set to logic low, which disables the low level voltage clamp. Simultaneously or slightly before this, the resistance control signal 130 is switched from 0 to a non-high impedance value that varies with time such as to regulate the amplitude 404. When this switch occurs, the amplitude 404 is regulated by the active load (i.e. the variable resistance 116) to ramp up such that the amplitude 404 of the voltage across the pins 110, 112 lies close to the real supply voltage 400, i.e. NFC signals are able to make full use of the supply voltage range. This is achieved and subsequently maintained by the value of the resistance control signal 130 fluctuating in real-time to offset any detected difference between the amplitude 404 and the real supply voltage 400.

At a subsequent time 418 at the end of duration 412, the system-on-chip 102 is once again set to an NFC inactive mode for a duration 414. At this time 418, the enable clamp low signal 128 is set to logic high, re-enabling the low level voltage clamp, and the resistance control signal 130 is set to 0, thus setting the variable resistance 116 to a high impedance mode. It is noteworthy that unlike when switching to an NFC active mode, the amplitude 404 does not undergo a ramp but instead is clipped to just under the low limit immediately.

When an NFC antenna is connected, the enable clamp high signal 126 will be set to logic high to limit the voltage across the pins 110, 112 to the upper limit of the design supply voltage range such that the device cannot be damaged by high voltages regardless of any other settings. Thus although the enable clamp low signal 128 may be set to logic low for certain periods so that the variable resistance 116 can adjust the amplitude of the voltage swing to allow NFC signals to use the full supply voltage range, the upper limit clamp can remain on at all times in order to offer high voltage protection to the circuit without affecting the operation of the shunt regulation loop (i.e. the variable resistance 116).

When the system-on-chip 102 is to be used only for digital GPIO purposes (i.e. no antenna will be connected to the pins 110, 112), both the high and low limit clamps will be disabled by setting both the enable clamp high signal 126 and enable clamp low signal 128 to logic low. This reduces leakage between the pins 110, 112 and prevents short circuits if the pins 110, 112 are driven to different logic values.

Thus it will be seen that a system-on-chip that shares pins between multiple circuits has been described. When a voltage clamp is used it is possible to adjust the circuit to utilise the full range of a time-varying supply voltage when needed and employ a more restrictive clamp when it is not needed to save power. Although particular embodiments have been described in detail, many variations and modifications are possible within the scope of the invention.

The invention claimed is:

1. A semiconductor integrated circuit device comprising: at least first and second circuits, said first and second circuits being connected to a shared external connection, said device further comprising a voltage clamp that is operable to limit a voltage at the shared external connection, wherein said voltage clamp can be selectively enabled depending upon whether said first or second circuit is being used, wherein the second circuit comprises a general input/output interface such that the shared external connection can be used as a general input output connection.

2. The semiconductor integrated circuit device as claimed in claim 1 wherein the first circuit at least partly implements a near-field communication protocol and is configured to be connected to an external antenna via said shared external connection.

3. The semiconductor integrated circuit device as claimed in claim 1 forming part of an emulated near-field communication tag.

4. The semiconductor integrated circuit device as claimed in claim 1 wherein the voltage clamp is enabled when a near-field communication circuit is enabled so as to allow a near-field communication antenna to be safely attached and the voltage clamp is disabled when a near-field communication circuit is disabled.

5. The semiconductor integrated circuit device as claimed in claim 1 wherein the device comprises two shared external connections.

6. The semiconductor integrated circuit device as claimed in claim 5 wherein the voltage clamp is arranged to limit a maximum voltage that can be applied across said shared external connections.

7. The semiconductor integrated circuit device as claimed in claim 6 wherein at least two voltage clamps are provided with different clamp voltage values.

8. The semiconductor integrated circuit device as claimed in claim 7 wherein the circuit protected by the voltage clamps is a circuit having active and inactive modes.

9. The semiconductor integrated circuit device as claimed in claim 8 wherein the lower voltage clamp is enabled in the inactive mode but in the active mode the lower voltage clamp is disabled.

10. The semiconductor integrated circuit device as claimed in claim 8 comprising an alternative voltage control for controlling a voltage across the external connections in said active mode.

11. The semiconductor integrated circuit device as claimed in claim 10 wherein the alternative voltage control comprises a regulation loop.

12. The semiconductor integrated circuit device as claimed in claim 11 wherein the regulation loop comprises a variable resistance.

13. The semiconductor integrated circuit device as claimed in claim 11 wherein the regulation loop comprises a variable shunt resistance connected across the shared external connections.

14. The semiconductor integrated circuit device as claimed in claim 7 wherein the lower voltage clamp value is set at the lower end of a design supply voltage range.

15. The semiconductor integrated circuit device as claimed in claim 1 wherein the integrated semiconductor device comprises a field detection circuit.

16. A battery powered integrated circuit comprising: a semiconductor integrated circuit device comprising at least first and second circuits, said first and second circuits being connected to a shared external connection, said device further comprising a voltage clamp that is operable to limit a voltage at the shared external connection, wherein said voltage clamp can be selectively enabled depending upon whether said first or second circuit is being used, wherein the second circuit comprises a general input/output interface such that the shared external connection can be used as a general input output connection.

17. An assembly comprising:
a semiconductor integrated circuit device comprising at least first and second circuits, said first and second circuits being connected to a shared external connection, said device further comprising a voltage clamp that is operable to limit a voltage at the shared external connection, wherein said voltage clamp can be selectively enabled depending upon whether said first or second circuit is being used, wherein the second circuit comprises a general input/output interface such that the shared external connection can be used as a general input output connection; and
an antenna connected to said shared external connection.

* * * * *